United States Patent [19]

Takahashi et al.

[11] Patent Number: 5,315,092
[45] Date of Patent: May 24, 1994

[54] APPARATUS FOR HEAT-TREATING WAFER BY LIGHT-IRRADIATION AND DEVICE FOR MEASURING TEMPERATURE OF SUBSTRATE USED IN SUCH APPARATUS

[75] Inventors: Mitsukazu Takahashi; Takatoshi Chiba; Kiyofumi Nishii, all of Kyoto, Japan

[73] Assignee: Dainippon Screen Mfg. Co., Ltd., Kyoto, Japan

[21] Appl. No.: 774,943

[22] Filed: Oct. 11, 1991

[30] Foreign Application Priority Data

Oct. 11, 1990 [JP] Japan .................. 2-274989

[51] Int. Cl.$^5$ ............ H05B 1/02; H01L 21/00; H01L 21/02
[52] U.S. Cl. ............ 219/497; 219/121.43; 219/494; 392/418; 437/248; 437/173
[58] Field of Search .......... 219/497, 505, 412, 413, 219/494, 501, 121.43; 156/345; 437/248, 247, 173, 174; 392/418

[56] References Cited

U.S. PATENT DOCUMENTS

| | | |
|---|---|---|
| 4,924,073 | 5/1990 | Chiba . |
| 4,981,815 | 1/1991 | Kakoschke ............ 437/248 |
| 5,061,444 | 10/1991 | Nazuroff et al. ............ 437/248 |

FOREIGN PATENT DOCUMENTS

| | | |
|---|---|---|
| 58-175828 | 10/1983 | Japan . |
| 60-179829 | 5/1984 | Japan . |
| 59-101825 | 6/1984 | Japan . |
| 0093926 | 4/1987 | Japan ............ 437/248 |
| 63-18225 | 1/1988 | Japan . |
| 1-130526 | 3/1988 | Japan . |
| 63-86542 | 4/1988 | Japan . |
| 63-148623 | 6/1988 | Japan . |
| 63-160222 | 7/1988 | Japan . |
| 63-312630 | 12/1988 | Japan . |
| 0316428 | 12/1988 | Japan ............ 437/248 |
| 1-204114 | 8/1989 | Japan . |
| 2-20177 | 2/1990 | Japan . |

Primary Examiner—Mark H. Paschall
Attorney, Agent, or Firm—Lowe, Price, LeBlanc & Becker

[57] ABSTRACT

A temperature measuring device for measuring the temperature of a wafer heated by light irradiation includes: a sheath thermocouple for detecting the temperature of a wafer to be measured by contacting the wafer to be measured; and a covering member for covering the surface of the sheath thermocouple. The surface of the covering member is flat in a predetermined region, and the part in the region can plane-contact the surface of the wafer. Thus, the temperature of the wafer can be measured accurately and in a stable manner, and the wafer surface is free from contamination with adhesives or the metal of the thermocouple.

22 Claims, 3 Drawing Sheets

APPARATUS FOR HEAT-TREATING WAFER BY LIGHT-IRRADIATION AND DEVICE FOR MEASURING TEMPERATURE OF SUBSTRATE USED IN SUCH APPARATUS

BACKGROUND OF THE INVENTION

1. Field of the Invention

The present invention relates generally to an apparatus for heat-treating various substrates such as a semiconductor substrate (hereinafter referred to as "wafer") using light-irradiation, and more specifically to, an apparatus for controlling a heat-treatment of a wafer in a closed loop by measuring the temperature of the wafer undergoing the heat-treatment in a light-irradiation heating furnace and a temperature measuring device used in such an apparatus.

2. Description of the Related Art

In a process of manufacturing a semiconductor wafer, various kinds of films and impurity regions should be formed in a wafer. In these steps, the wafer is heat-treated in a light-irradiation heating furnace. As integration of a semiconductor device increases and integration of circuitry fabricated on a single wafer intensifies, the manufacturing process of the wafer has become very much complicated. It is particularly important to control the temperature of the surface of a wafer undergoing a heat-treatment, in order to maintain product yield. The temperature of the surface of a wafer must therefore be measured accurately.

A conventional technique of measuring the temperature of a wafer surface is disclosed in Japanese Patent Laying-Open No. 63-148623. According to the technique, a thermocouple is used for measuring the temperature of a wafer surface. The thermocouple is directly contacted to the wafer surface, or fixed to the surface of the wafer by heat resisting adhesive.

According to this conventional approach, the metal wire of the thermocouple directly contacts the surface of the wafer to be measured. The direct contact allows the temperature of the wafer to be measured accurately.

On the other hand, according to this method, the wafer is contaminated by the metal of the thermocouple because its metal wire directly contacts the wafer. Further, metal components evaporated from these elements contaminate the wafer surface inside the light-irradiation heating furnace. As is well known, a thermocouple having a long and narrow line shaped external form can render its contact to the wafer unstable. In order to avoid such instability, the thermocouple should be fixed to the wafer surface by heat resisting adhesive, etc. Contamination of the wafer surface is therefore inevitable, and this temperature measuring technique is not applicable to wafers provided in fabrication of semiconductor devices.

Another conventional technique is disclosed, for example, in Japanese Utility Model laying-Open No. 60-179829. Referring to FIG. 1, an apparatus for heat-treating a wafer in accordance with this conventional technique includes a light-irradiation heating furnace 10 formed of quartz glass, a plurality of lamp heaters 20 provided above and below the light-irradiation heating furnace 10, a reflection plate 22 provided at the rear of the lamp heaters 20, a susceptor 36 for holding a wafer 30 in the light-irradiation heating furnace 10, and a furnace wall 52 for sealing one end of the light-irradiation heating furnace 10. Provided on the top of the light-irradiation heating furnace 10 are a guide tube 58 formed of quartz glass, a lens 60 positioned above the reflection plate 22, a light receiving sensor 62 provided at a position at which light is collected by the lens 60, a glass tube 64 having the light receiving sensor 62 on its axis line and disposed at a predetermined angle relative to the guide tube 58, a reference heat source 66 provided at one end opposing the light receiving sensor 62 and having its temperature kept constant, a rotating light shielding plate 68 for shielding alternately the axis line of the tube 58 and the axis line of the glass tube 64 in accordance with its rotation, a light shielding plate driver 72 for driving the rotating light shielding plate 68, and a measurement circuit 70 for finding the temperature of the wafers 30 from an output of the light receiving sensor 62.

Provided at the light-irradiation heating furnace 10 are a gas inlet 54 for introducing $N_2$ gas, etc. into the light-irradiation heating furnace 10, and a gas outlet 56 through which the gas is exhausted. The susceptor 36 is carried by an arm 50, and the arm 50 extends externally from the light-irradiation heating furnace 10 through an opening provided at the furnace wall 52. The furnace wall 52 and the arm 50 move as one body, and, therefore, the wafer 30 is in/out from the light-irradiation heating furnace 10.

The conventional device shown in FIG. 1 operates as follows. Light emitted from the lamp heater 20 reaches the wafer 30 directly or reflected by the reflection plate 22, thereby heating the wafer 30. The wafer 30 generates radiation (infrared) light in accordance with its temperature. The radiation light is introduced into the guide tube 58, and collected by the lens 60 onto the light receiving surface of the light receiving sensor 62. Radiation light emitted from the reference heat source 66 is also collected onto the light receiving surface of the light receiving sensors 62 at that time. The rotating movement of the rotating light shielding plate 68 allows light from the wafer 30 and light from the reference heat source 66 to enter alternately into the light receiving sensor 62.

The light receiving sensor 62 alternately produces an output in accordance with the light emitted from the wafer 30, and an output in accordance with the light emitted from the reference heat source 66 and apply the same to the measuring circuit 70. The measuring circuit 70 samples an output of the light receiving sensor 62 at a timing in synchronization with the rotation of the rotating light shielding plate 68. The sampled values are separated into the values representing the temperature of the wafer 30 and the values representing the temperature of the reference heat source 66, and comparison is conducted between these values. Based on the result of the comparison, the relation between the temperature of the wafer 30 and the temperature of the reference heat source 66 is found, and the temperature of the wafer 30 can be kept constant by controlling the lamp heater 20 according to the obtained relation.

An apparatus as described above can measure the temperature of the wafer 30 on a non-contact basis. It is not necessary to make the thermocouple contact the surface of the wafer 30. Contamination of the surface of the wafer 30 by the metal wire of the thermocouple or adhesive can be avoided as a result. However, this method also bears problems yet to be solved as follows.

Wafers with different film structures or impurity concentrations are different in their emissivity. It is necessary to find the emissivity of each wafer before heat-treatment, in order to measure the temperature of the wafer accurately. This requires a number of operations which are cumbersome. The emissivity of the wafer 30 also changes with a change in air temperature. Therefore, the accurate temperature of the wafer can only be found within a considerably narrow range of temperatures.

Moreover, there exists another problem as follows. Some kind of change can takes place in the wafer when the heating is going on, for example, a change in composition according to, for example, the formation of an oxide film or a change in particle diameter due to the crystal state of polycrystalline silicon. Such a change can be responsible for a change in the emissivity of the wafer 30. It is therefore extremely difficult to always measure its accurate temperature when such a wafer undergoes heat-treatment.

A third conventional technique is disclosed in U.S. Pat. No. 4,924,073. U.S. Pat. No. 4,924,073, is incorporated herein by reference.

According to U.S. Pat. No. 4,924,073, controlling the temperature of a wafer when the wafer is heat-treated can be performed accurately both at the time of activation and resumption of the treatment after the treatment is once interrupted. The approach only requires a relatively simple apparatus structure.

The apparatus disclosed in U.S. Pat. No. 4,924,073 does not measure the temperature of the wafer when the wafer is actually undergoing the heat treatment. It is therefore impossible to find accurately by this method what temperature the wafer has when undergoing the treatment. Prior to a heat-treatment product wafer of a treatment using a dummy wafer must be conducted repeatedly. Different kinds of dummies should be prepared depending upon kinds of product wafers. Such preparation steps should be reduced.

SUMMARY OF THE INVENTION

It is therefore an object of the present invention to provide a heat-treating apparatus for a wafer utilizing light-irradiation, in which control of the temperature of a wafer can be conducted accurately while maintaining the quality of the wafer while reducing the number of preparation steps, and to provide a temperature measuring device for a wafer used in such an apparatus.

Another object of the present invention is to provide a wafer heat-treating apparatus utilizing light-irradiation, by which the temperature of a wafer can always be controlled accurately while maintaining the quality of a wafer and capable of reducing the number of preparation steps, and to provide a temperature measuring device for a wafer used in such an apparatus.

Another object of the present invention is to measure and control the temperature of a product wafer undergoing heat-treatment, while maintaining the quality of the manufactured wafer, without repetitive steps using a number of dummy wafers.

A further object of the present invention is to always measure and control accurately the temperature of a wafer by directly contacting a temperature measuring device onto the surface of the wafer undergoing heat-treatment, and yet to maintain the quality of the wafer.

Yet another object of the present invention is to measure and control accurately the temperature of a wafer regardless of its kind, while maintaining the quality of the wafer.

A still further object of the present invention is to provide a heat-treatment apparatus for a wafer and a temperature measuring device for a wafer used in such an apparatus by which the accurate temperature of a wafer can be measured and controlled over a wide range of temperatures and contamination of the wafer can be eliminated.

A still further object of the present invention is to provide a heat-treatment apparatus for a wafer and a temperature measuring device used in such an apparatus for a wafer by which the accurate temperature of a wafer having a film having a tendency to cause a change in emissivity in the process of heat-treatment can be measured over a wide range of temperatures while the surface of the wafer can be protected against contamination.

A still further object of the present invention is to provide a heating apparatus for a wafer and a wafer temperature measuring device therefor by which the accurate temperature of a wafer is measured by directly contacting the temperature measuring device to the wafer while contamination of the surface of the wafer can be eliminated.

A temperature measuring device in accordance with the present invention which has a light-irradiation heating furnace and a radiation light-irradiation heating device provided in the light-irradiation heating furnace, and is used for measuring the temperature of a wafer in an apparatus for heating a wafer in the light-irradiation heating furnace by the light-irradiation heating device includes: a temperature detector for detecting the temperature a wafer to be measured by contacting the wafer to be measured; and a covering member for covering the surface of the temperature detector. The surface of the covering member is flat in a predetermined first region, and the first region of the surface of the covering member can plane-contact the surface of the wafer.

The plane-contacting of the covering member to the bottom of the wafer allows efficient heat conduction from the wafer to the covering member. Detection of the temperature of the wafer using the temperature detector can therefore be made accurately. Furthermore, the temperature detector and the surface of the wafer are in plane-contact through the covering member and are less likely to shift from each other. Consequently, it will not be necessary to fix the temperature detector onto the surface of the wafer by the aid of the adhesives, etc., and, therefore, there is no possibility of contaminating the surface of the wafer with the applied adhesive. The temperature detector is separated from the wafer surface by the covering member. Therefore, there is no possibility of contaminating the wafer surface with metal components contained in the temperature detector. The covering member surrounds the periphery of the temperature detector. Heat conducted from the wafer is immediately transmitted also to the parts of the covering member other than the part in contact with the wafer because the covering member has an extremely small heat capacity compared to the wafer, and the entire covering member will have a temperature substantially the same as the wafer. The temperature distribution around the temperature detector is therefore likely to be even, so that temperature detection of the wafer by the temperature detector is conducted more accurately.

In accordance with another aspect of the present invention, a wafer heating apparatus includes: a hollow furnace for accommodating a wafer; a susceptor having one or more supporting points for supporting the wafer accommodated in the furnace thereon; a light source provided in the furnace for heating the wafer supported by the susceptor with light-irradiation; a temperature detector provided in the furnace for measuring the temperature of the wafer; a controller for controlling the light source in response to an output from the temperature detector so that the temperature of the wafer attains a predetermined constant value; and a member for fixing the temperature detector in such a manner that the upper one or more points thereof, together with the susceptor, define the plane on which the wafer is placed. The temperature measuring device includes a temperature detector for detecting the temperature of a wafer to be measured by contacting the wafer, and a covering member for covering the surface of the temperature detector.

The wafer can be held stably by the susceptor and the covering member of the temperature detector in this apparatus. The temperature of the wafer is efficiently transmitted by conduction to the temperature detector through the covering member. Therefore, accurate measurement of the temperature of the wafer can be conducted, so that control of the temperature of the furnace can be made appropriately. Furthermore, it will not be necessary to attach the temperature detector to the wafer by the aid of adhesives, etc. and, therefore, the wafer will not be contaminated.

The temperature detector is separated from the wafer surface by the covering member. There is therefore no possibility of contaminating the wafer surface by metal components contained in the temperature detector.

The periphery of the temperature detector is surrounded by the covering member. Heat conducted from the wafer to the covering member is also applied to the temperature detector from the part of the covering member other than the part in contact with the wafer. The temperature distribution in the periphery of the detector is likely to be even, and, therefore, the wafer temperature detected by the temperature detector will be more accurate.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
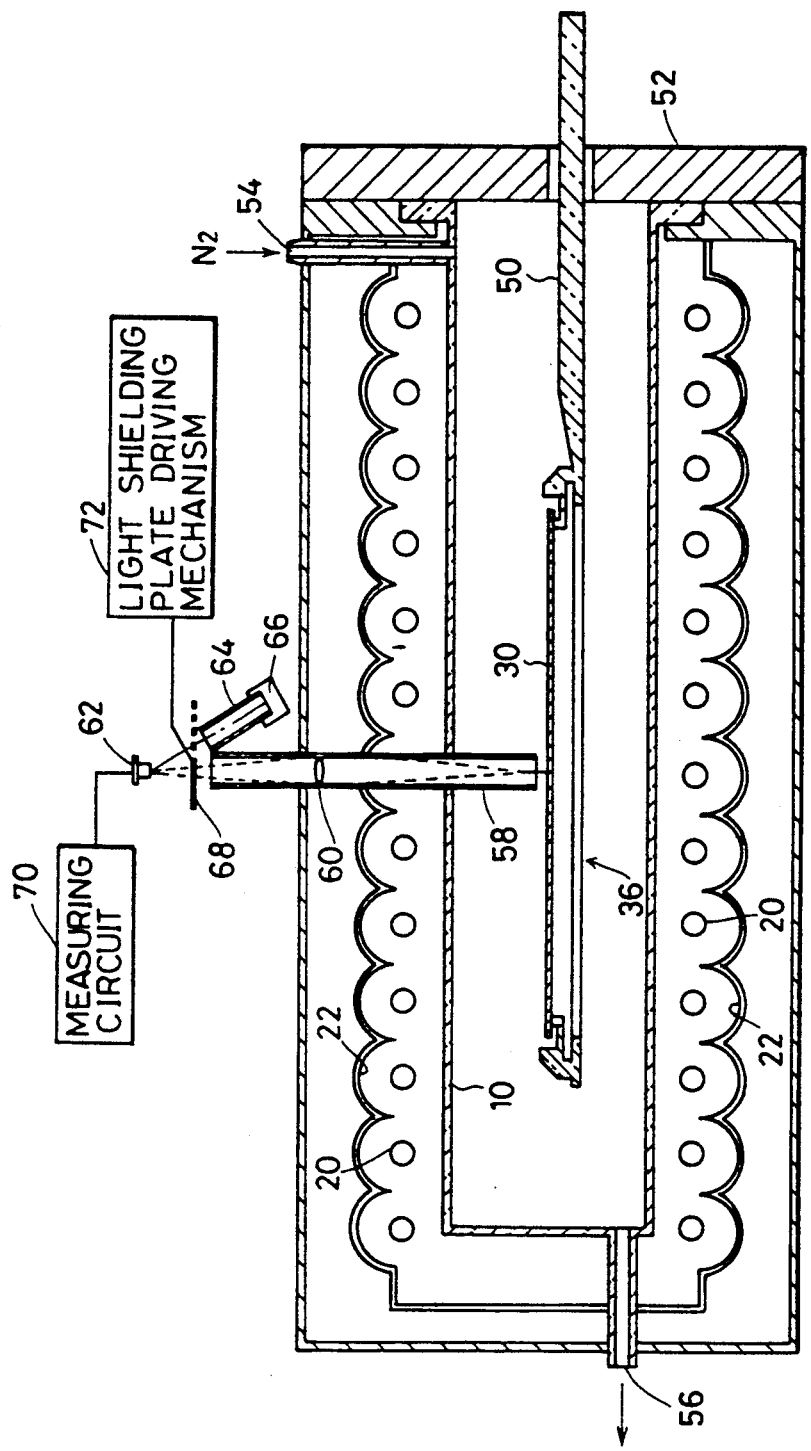
FIG. 1 is a sectional view schematically showing a heat-treating apparatus for a substrate in accordance with a conventional technique.
Figure 2:
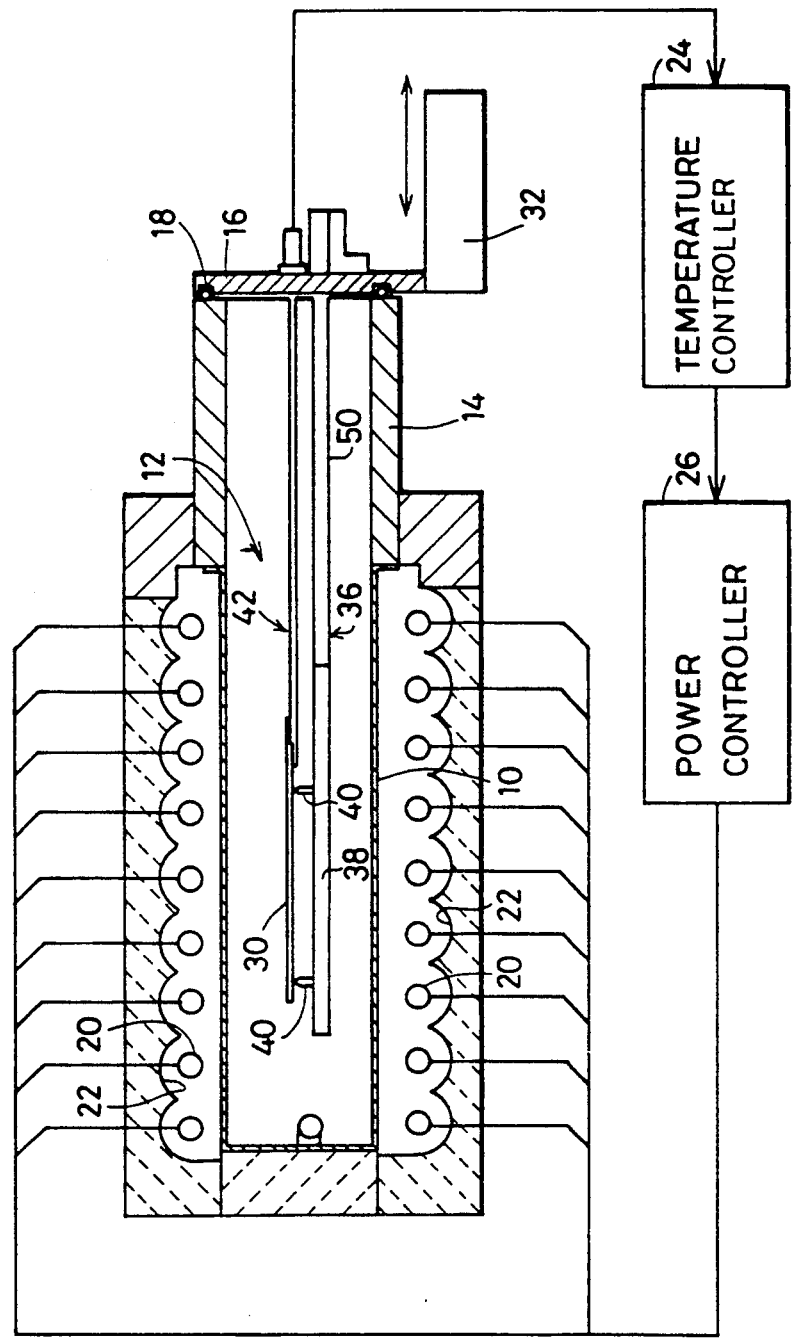
FIG. 2 is a sectional view schematically showing a side of a heat-treating apparatus for a substrate in accordance with one embodiment of the present invention.

Referring to FIG. 2, a heat-treating apparatus of light irradiation type for a wafer in accordance with one embodiment of the present invention includes a light-irradiation heating furnace 10 formed of quartz glass having an inlet/outlet 12 through which a wafer is inserted and taken out, a sub chamber 14 coupled to the inlet/outlet 12 of the light-irradiation heating furnace 10, a flange portion 16 for air-tightly sealing the sub chamber 14, a susceptor 36 formed of quartz glass fixed to the flange portion 16 for supporting the wafer, a temperature detector 42 for holding the wafer 30 with the susceptor 36 and for detecting the temperature of the wafer 30 by contacting thereto, a plurality of lamp heaters 20 provided on the inner top and bottom surfaces of the light-irradiation heating furnace 10, and reflection plates 22 at the back of each of the lamp heaters 20.

The susceptor 36 includes an arm portion 50 with one end fixed to the flange portion 16, a circular part 38 provided at a tip of the arm portion 50 having a diameter a little larger than that of the wafer 30, and protruding supports 40 provided protruding upwardly at two points to form a regular triangle with the tip of the temperature detector 42 in the inner periphery of the circular part 38 and for supporting the wafer 30 at their tips together with the tip of the temperature detector 42.

A packing 18 for keeping the inside of the light-irradiation heating furnace 10 air-tightly sealed is mounted between the flange portion 16 and the end wall surface of the sub chamber 14. The flange portion 16 is fixed to a supporting block 32. The supporting block 32 makes linear movement in the direction indicated by an arrow, driven by a driving mechanism (not shown). In accordance with the movement of the supporting block 32, the inlet/outlet of the end wall surface of the sub chamber 14 is opened/closed, and the wafer 30 is let in/out into/from the light-irradiation heating furnace 10 accordingly.

A halogen lamp, a xenon arc lamp or the like is used for the lamp heater 20.

The wafer heating apparatus further includes a temperature controller 24 connected to the temperature detector 42 for outputting a signal for controlling power for the lamp heater 20 based on the values of a detected temperature and a prescribed temperature, and a power controller 26 connected to the temperature controller 24 for supplying the desired power to the lamp heater 20 in accordance with the applied temperature control signal.

Figure 5:
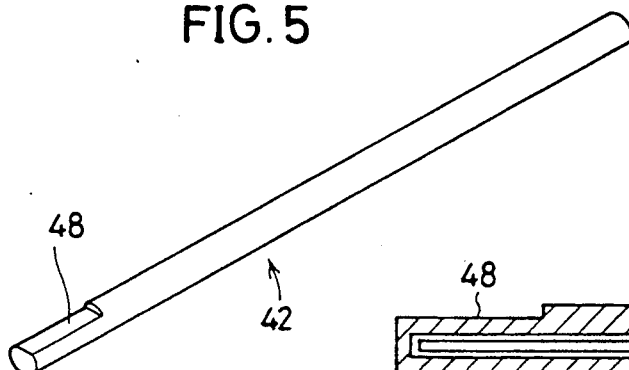
FIG. 5 is an overview perspective illustration of a temperature measuring device in accordance with one embodiment of the present invention.
Figure 6:
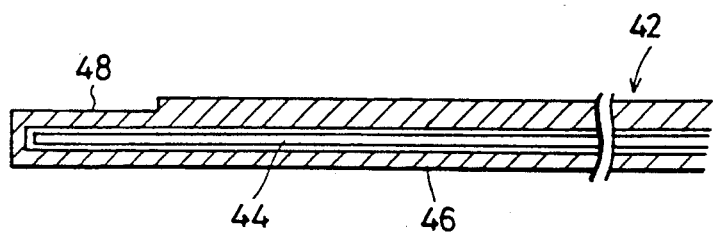
FIG. 6 is a sectional view showing a side of the temperature measuring device shown in FIG. 5.

The temperature detector 42, by referring to FIGS. 5 and 6, includes a sheath thermocouple 44, and a tube shaped covering member 46 for covering the entire length of the sheath thermocouple 44. The covering member 46 is, for example, a tube having a cross-section of a narrow and long circle with its top end closed, which has an outer diameter of 0.8 mm and inner diameter of about 0.4 mm, and a length of about 200 mm. A flat surface 48 having a width of about 0.55 mm, and a length of about 15 mm is formed at the end of the covering member 48.

Figure 3:
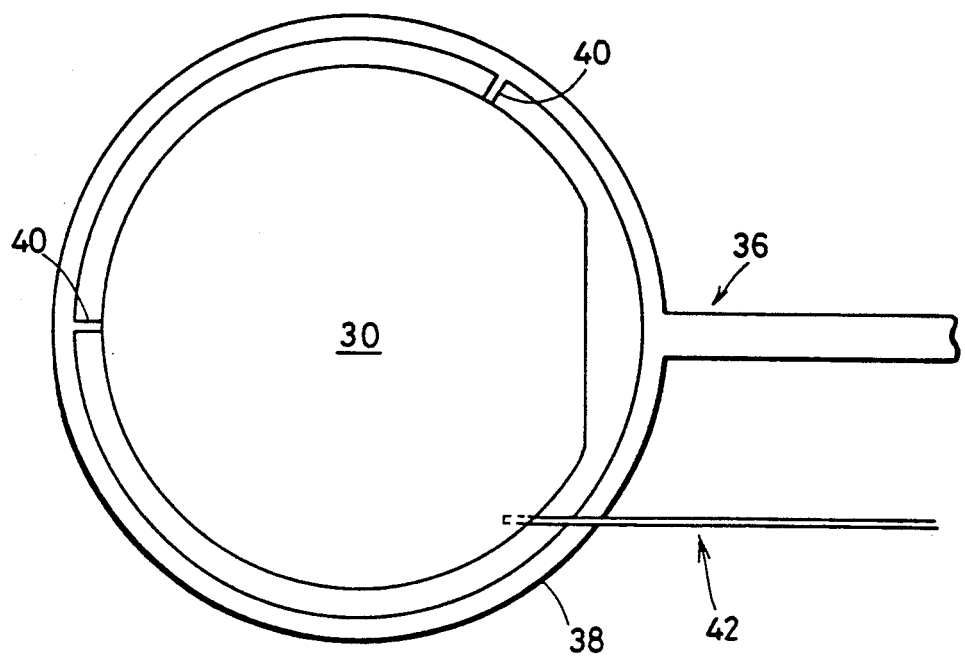
FIG. 3 is a plan view showing the placement of a susceptor for supporting a wafer and a temperature measuring device in a wafer heating apparatus in accordance with one embodiment of the present invention.
Figure 4:
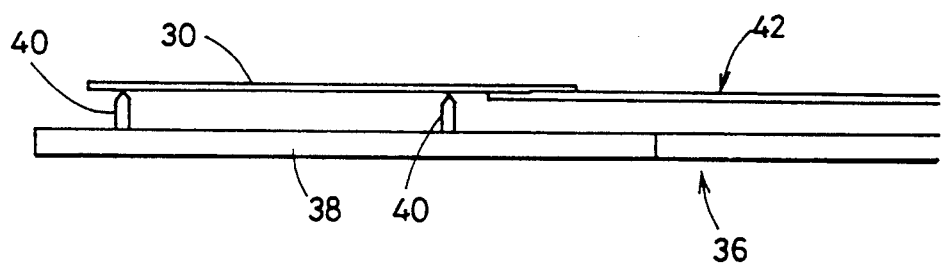
FIG. 4 is a side plan view of FIG. 3.

As shown in FIGS. 2 to 4, the bottom surface of the wafer 30 plane-contacts the flat surface 48. The covering member 46 is formed of high purity silicon carbide (SiC). The covering member 46 is formed, for example, by preparing a bar shaped piece having an outer diameter identical to the inner form of the covering member 46, and forming a thin film of high purity SiC on its surface by means of CVD (Chemical Vapor Deposition) method, and subsequently removing the piece inside by means of chemical treatment.

SiC formed by CVD method is known as having high heat resistance and high heat conduction. An extremely thin, hollow tube can be relatively readily manufactured by CVD method.

The volume of SiC for forming the covering member 46 is extremely small as compared to the volume of the wafer 30, and, therefore, its heat capacity is also extremely small. The direct contact of the covering member 46 onto the wafer 36 will not adversely affect the distribution of heat over the wafer 30. SiC does not contain any impurity which will be a contaminant to the surface of the wafer 30. Therefore, there will be no possibility of contaminating the surface of the wafer 30 by directly contacting the temperature detector 42 to the bottom surface of the wafer 30.

The sheath thermocouple 44 is formed by sealing a metal wire and a filling agent such as MgO into a metal tube such as a stainless tube or an inconel tube, in order to prevent disconnection or deterioration of the metal wire of the thermocouple.

Referring to FIGS. 2 to 6, the heat-treating apparatus for a wafer and the temperature measuring device for a wafer operate as follows. The supporting block 32 is initially moved by a driving mechanism (not shown) to such a position letting open the inlet/outlet at one end of the sub chamber. The susceptor 36 and the temperature detector 42, both being fixed to the flange portion 16, move with the flange portion 16 to the side of the sub chamber 14. The wafer 30 is placed by a wafer conveying mechanism (not shown) on the plane defined by the tips of the protruding support 40 and the flat surface 48 of the temperature detector 42. The supporting blocks 32 moves to such a position to seal the inlet/outlet of the sub chamber 14 by the flange portion 16. As the flange portion 16 moves, the susceptor 36, the temperature detector 42, and the wafer 30 supported by the susceptor 36 and the temperature detector 42 are inserted into the light-irradiation heating furnace 10.

The temperature of the wafer 30 is transmitted to the covering member 46 of the temperature detector 42 by heat conduction through the plane in contact between the bottom surface of the wafer 30 and the flat surface 48 at the end of the covering member 46. At that time, the heat capacity of the covering member 46 as described above is extremely small as compared to that of the wafer 30. The temperature of the flat surface 48 of the covering member 46 therefore changes following a change in the temperature of the wafer 30 with an extremely high response to the temperature change. The temperatures of the other parts of the covering member 46 change by heat conduction inside the covering member 46.

As shown in FIG. 6, the sheath thermocouple 44 is inserted into the covering member 46 as close as possible to closed end of the covering member 46. The sheath thermocouple 44 is heated by the covering member 46 in its entire periphery. The temperature at the end of the covering member 46 can therefore be accurately measured by the sheath thermocouple 44.

At that time, the sheath thermocouple 44 is separated from the heated atmosphere inside the light-irradiation heating furnace 10 by the covering member 46. Metal components contained in the sheath will not be discharged outside the covering member 46, and, therefore, there will be no possibility of the metal components of the sheath contaminating the surface of the wafer 30. Also, as described above, the covering member 46 is formed of high purity SiC. Therefore, there will be no contamination of the surface of the wafer 30 by the covering member 46.

In order to keep the wafer 30 from being in direct contact with the sheath thermocouple 44, it is enough to cover only the part of the surface of the thermocouple which otherwise will be in contact with the bottom surface of the wafer 30 with the covering member. However, with the covering member 46 covering the entire surface of the sheath thermocouple 44 as described by referring to the embodiments, the part other than facing the wafer in the surface of the sheath thermocouple receives heat from the covering member 46, and, therefore, detection of the temperature of the covering member 46 becomes accurate. Also, the sheath thermocouple 44 is separated from the heated atmosphere in the light-irradiation heating furnace 10 by the covering member 46, and, therefore, there will be no possibility that the surface of the wafer 30 is contaminated by evaporated metal components contained in the sheath.

Based on the temperature thus detected by the temperature detector 42, power to be supplied to the lamp heater 20 by the temperature controller 24 is found, and a power control signal is applied to the power controller 26. The power controller 26 controls power applied to each of the lamp heaters 20 based on the power control signal. The temperature detector 42 detects the temperature of the wafer 30 by directly contacting the wafer 30, and therefore, the temperature of the wafer 30 obtained will be considerably accurate. Control of the lamp heaters 20 by the temperature regulator 24 and the power controller 26 can appropriately be conducted, so that the heat-treatment of the wafer 30 can be successfully performed. Appropriate temperature control can be made regardless of the kind of the wafer, because the temperature of the product wafer 30 is measured by direct contact. Also, dummy wafers and preparation steps using the dummy wafers prior to the heat-treatment will not be necessary.

The flat surface 48 provided to the covering member 46 together with the susceptor 36 stably supports the wafer 30 to be heat-treated by plane-contact. The stable contact between the bottom surface of the wafer 30 and the flat surface 48 of the covering member 46 allows the heat of the wafer 30 to be conducted efficiently and the temperature can be measured in a stable manner. It is not necessary to join temperature detecting means and a wafer using adhesive, etc. as practiced by a conventional method, in order to keep a good contact between the means for measuring the temperature and the wafer. This results in increased operation efficiency, and the surface of the wafer can be protected against contamination by the adhesives.

Description has been given based on one embodiment of the present invention, but the present invention is by no means limited to the above-described embodiment. For example, in the embodiment, the cross-sectional form of the covering member 46 of the temperature detector is circular, but the cross-sectional form of the covering member is not limited thereto. The covering member may be of any tubular type through which the sheath thermocouple can be inserted. For instance, a tube having a cross section of a polygon or a cross section of a flat rectangle or ellipse may be employed. In the above embodiments, the flat surface 48 is provided near the end of the covering member 48. The form of the flat surface 48 is however not limited to the shape shown in FIGS. 5 and 6. Any shape of flat surface may be employed, in so far as the covering member can be in direct contact with the bottom surface of the wafer 30 in a certain area.

In the above-described embodiment, the covering member 46 is of high purity SiC formed by CVD method. However, the present invention is by no means limited thereto, and the covering member can be of high purity ceramics having no possibility of contaminating the surface of the wafer, for example, PBN (Pyrolytic Boron Nitride).

In the above-described embodiment, as shown in FIG. 2, the susceptor 36 and the temperature detector 42 are both fixed to the flange 16, and come in and withdraw from the heating furnace 10 in accordance with the movement of the supporting blocks 32. Another possible approach is to employ an apparatus in which the susceptor and temperature detector are fixed in the light-irradiation heating furnace 10. In this case, the wafer is placed on and taken out from the susceptor and temperature detector by a robot having arms for conveying the wafer.

In the above-described embodiment, the sheath thermocouple is used as temperature measuring means for the temperature detector. But the temperature detecting means is not limited to the use of the sheath thermocouple, and any device for measuring the temperature of an object to be measured by contacting the object such as an ordinary thermocouple of general use, a platinum resistance thermometer bulb in stead of a thermocouple, may be used.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. In a wafer heating apparatus including a light-irradiation heating furnace and light-irradiation heating means for heating a wafer in said light-irradiation heating means, a device for measuring the temperature of the wafer, comprising:
   temperature detecting means for detecting the temperature of a wafer, which wafer is heated by said light-irradiation heating means; and
   a covering member for covering the surface of said temperature detecting means,
   the surface of said covering member being flat in a predetermined first region, wherein
   said first region of the surface of said covering member being adapted to contact a surface of the wafer in a planar surface-to-surface relationship and support the wafer.

2. A temperature measuring device as recited in claim 1, wherein the outer form of said covering member is flat in the part which will be in contact with the bottom surface of the wafer.

3. A temperature measuring device as recited in claim 1, wherein
   said temperature detecting means does not contact the bottom surface of the wafer in a predetermined first area its surface, and
   a cross-section taken in the direction intersecting the lengthwise direction of said covering member in said first area is circular.

4. A temperature measuring device as recited in claim 3, wherein
   a cross-section taken in the direction intersecting the lengthwise direction in a predetermined second area of the covering member in contact with the bottom surface of the wafer is a circle having a part cut away by a straight line defined by the bottom surface of the wafer in the part in contact with the wafer.

5. A temperature measuring device as recited in claim 4, wherein one end of said covering member is closed and said second area is adjacent to said closed one end of said covering member.

6. A temperature measuring device as recited in claim 1, wherein one end of said covering member is closed and a predetermined second area of the covering member in contact with the bottom surface of the wafer is adjacent to said closed one end of said covering member.

7. A temperature measuring device as recited in claim 1, wherein said covering member includes a ceramic material having heat resistance and strength.

8. A temperature measuring device as recited in claim 7, wherein said covering member includes silicon carbide.

9. A temperature measuring device as recited in claim 8, wherein said covering member is a silicon carbide film formed by a chemical vapor deposition method.

10. A temperature measuring device as recited in claim 1, wherein said temperature detecting means includes a thermocouple.

11. An apparatus for heat treating a wafer comprising:
    a hollow furnace for accommodating a wafer;
    a wafer supporting means having one or more supporting points, for supporting the wafer accommodated is said furnace on said one or more supporting points;
    light-irradiation heating mans for heating by light-irradiation the wafer supported by said wafer supporting means;
    temperature measuring means for measuring the temperature of the wafer;
    control means responsive to an output of said temperature measuring means, for controlling said light-irradiation heating means so that the temperature of the wafer is at a predetermined constant value; and
    holding means for holding said temperature measuring means in said furnace in such a manner that said temperature measuring means and said one or more supporting points support the wafer, wherein
    said temperature measuring means includes temperature detecting means for detecting the temperature of said wafer to be measuring, and
    a covering member for covering the entire surface of said temperature detecting means and having a flat surface for coming into flat contact with a bottom surface of the wafer.

12. An apparatus as recited in claim 11, wherein the outer form of said covering member is flat in the part in contact with the bottom surface of the wafer.

13. An apparatus as recited in claim 11, wherein
    said temperature measuring means does not contact the bottom surface of the wafer in a predetermined second area of the surface, and a cross section of said covering member taken in the direction intersecting its lengthwise direction in said second area is circular.

14. An apparatus as recited in claim 13, wherein a cross section of said covering member taken in the direction intersecting its lengthwise direction in said first area is a circle having a part cut away by a straight line defined by the bottom surface of the wafer in the part in contact with the wafer.

15. An apparatus as recited in claim 14, wherein one end of said covering member is closed, and said first area is adjacent to said closed one end of said covering member.

16. An apparatus as recited in claim 11, wherein one end of said covering member is closed, and said first area is adjacent to said closed one end of said covering member.

17. An apparatus as recited in claim 11, wherein said covering member includes a ceramic material having heat resistance and strength.

18. An apparatus as recited in claim 17, wherein said covering member includes silicon carbide.

19. An apparatus as recited in claim 18, wherein said covering member is a silicon carbide film formed by a CVD method.

20. A temperature measuring device as recited in claim 11, wherein said temperature detecting means includes a thermocouple.

21. An apparatus as recited in claim 11, wherein said wafer supporting means is also fixed to said means for fixing said temperature measuring means, and
said temperature measuring means plane-contacts the bottom surface of said wafer when the wafer is placed on said wafer supporting means.

22. An apparatus as recited in claim 21, wherein said means for fixing said temperature measuring means can come in and withdraw to and from said furnace, whereby said wafer is let in/out from said furnace while being supported by said wafer supporting means and said temperature measuring means.

* * * * *